(12) United States Patent
Lu

(10) Patent No.: US 6,753,117 B2
(45) Date of Patent: Jun. 22, 2004

(54) METHOD FOR REDUCING LINE EDGE ROUGHNESS OF PATTERNED PHOTORESIST

(75) Inventor: Yen-Ting Lu, Taichung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 89 days.

(21) Appl. No.: 09/919,868

(22) Filed: Aug. 2, 2001

(65) Prior Publication Data

US 2003/0027080 A1 Feb. 6, 2003

(51) Int. Cl.$^7$ ................................................ G03F 5/00
(52) U.S. Cl. ........................ 430/30; 430/315; 430/324; 430/330; 430/942
(58) Field of Search ........................ 430/30, 296, 315, 430/324, 330, 942

(56) References Cited

U.S. PATENT DOCUMENTS 5,780,187 A * 7/1998 Pierrat ........................ 430/324
6,197,455 B1 * 3/2001 Yedur et al. ................. 430/324
6,225,031 B1 * 5/2001 Appelt et al. ................ 430/324

* cited by examiner

Primary Examiner—Christopher G. Young

(57) ABSTRACT

A method for reducing line edge roughness of patterned photoresist, include at least: provide a patterned photoresist which has at least a trench and is located on a substrate; fill trenches so let that trenches are totally filled by an additional material, wherein the additional material is easily to bond with the patterned photoresist; remove part of the additional material which is located on patterned photoresist and the substrate; and treat the additional material so let that adhesion between the additional material and patterned photoresist is enhanced after the additional material is treated. Moreover, while only trenches are filled by the additional material, step of removing part of the additional material could be omitted; while adhesion between the additional material and patterned photoresist is good, step of treating the additional material could be omitted.

33 Claims, 6 Drawing Sheets

METHOD FOR REDUCING LINE EDGE ROUGHNESS OF PATTERNED PHOTORESIST

BACKGROUND OF THE INVENTION

1. Field of the Invention

This invention relates generally to method for reducing line edge roughness of patterned photoresist, and particularly relates to a method for improving precision of pattern of patterned photoresist without changing patterned photoresist material or changing both is develop process and bake process.

2. Description of the Prior Art

For semiconductor fabrication, patterned photoresist is an indispensable part for transferring pattern of a mask into a semiconductor substrate. Because the pattern of patterned photoresist essential is the pattern of the semiconductor substrate, how to ensure the pattern of patterned photoresist is equal to the mask is an important key for whether the pattern is accurately transferred or not.

Because practical semiconductor fabrication is limited by numerous factors, such as available materials of both patterned photoresist and a developer, unavoidable errors during both developing process and priming process, standing wave phenomena, and non-uniform distribution of polymers which are composition of patterned photoresist. It is usually that some trenches are existent in formed patterned photoresist that is patterned. Owing to location and number of trenches are random distributed, disadvantages such as non-smooth surface and line width variation is occurred and usually is called as line edge roughness. FIG. 1A and FIG. 1B illustrate ideal shape of patterned photoresist, and both FIG. 1C and FIG. 1D qualitatively show real shape of patterned photoresist while line edge roughness is happened. Herein, all figures are not illustrated in according to practical scale for emphasizing possible variation, patterned photoresist is formed on the semiconductor substrate 10, shape of patterned photoresist 11 could be any shape, and both location and shape of trenches 12 are random distributed.

Obviously, line width variation and non-smooth surface changes the shape of patterned photoresist, increases the critical dimension of patterned photoresist and disagrees the pattern on the semiconductor substrate with the actual shape. Thus, conventional semiconductor fabrication usually repairs patterned photoresist to reduce or eliminate line edge roughness of patterned photoresist before pattern of patterned photoresist is transferred into the semiconductor substrate.

Conventional semiconductor fabrications reduce line edge roughness of patterned photoresist by modifying temperature and/or period of soft bale process, hard bake process, and/or post exposure bake process. However, because standing wave phenomena is unavoidable while patterned photoresist is exposed by light and improvement is limited by the available material of patterned photoresist, conventional semiconductor fabrication could not effectively reduce, or even eliminate, line edge roughness of patterned photoresist.

As the following summary, the conventional semiconductor fabrication could not prevent defects of line edge roughness. Effects of line edge roughness are more and more serious while critical dimension of semiconductor device being continuously shrunk, it is desired to develop a new method for reducing line edge roughness of patterned photoresist.

SUMMARY OF THE INVENTION

One main object of this invention is to reduce line edge roughness of patterned photoresist effectively.

Another main object of this invention is to improve precision of patterned photoresist without changing patterned photoresist material or changing both develop process and bake process.

Still one main object of this invention is to reduce line edge roughness by filling, to accomplish good control ability for control line width of patterned photoresist effectively.

This present invention provides a method of reducing line edge roughness of patterned photoresist. Initially, provide a patterned photoresist which has at least a trench and is located on the substrate. Then fill these trenches so let that trenches are totally filled by an additional material, wherein the additional material is easily to bond with the patterned photoresist. Next, remove parts of the additional material that are located on patterned photoresist and the substrate. Finally, treat the additional material to enhance that adhesion between the additional material and patterned photoresist after the additional material is treated. Because trenches on patterned photoresist are filled by the additional material, real pattern of patterned photoresist could be equal to the ideal pattern, and then precession of patterned photoresist is enhanced.

Furthermore, this embodiment could be further modified as follows: omit step of removing part of the additional material while only trenches are filled by the additional material; and omit step of treating the additional material while adhesion between the additional material and patterned photoresist is good.

BRIEF DESCRIPTION OF THE DRAWINGS

A more complete appreciation and many of the attendant advantages will be readily obtained and better understood by reference to the following detailed description and accompanying drawings.

DESCRIPTION OF THE PREFERRED EMBODIMENT

Because choice of patterned photoresist material, baking time and baking temperature are strongly related to whole process for transferring pattern from the mask into patterned photoresist, none of to them could be decided only in accordance with requirement for preventing line edge roughness. Thus, this present invention reduces line edge roughness of patterned photoresist from another approach. First, use conventional semiconductor fabrication to form photoresist which has line edge roughness such as trenches, non-smooth surface, and line width variation. Then, fills trenches, or holes, in patterned photoresist by an additional material to reduce and eliminate non-smooth surface and line width variation. Finally, transferring the pattern into the semiconductor substrate by the patterned photoresist and the additional material.

Conventional semiconductor fabrication always uses patterned photoresist as the mask during an etch process and an implant process, so that patterned photoresist which is deformed by line edge roughness could not transform the pattern of the mask into the semiconductor substrate accurately. In contrast, the present invention repairs deformed patterned photoresist by filling trenches with an additional material, that is easily to bond with the patterned photoresist, and then uses both patterned photoresist and the additional material as the mask during etch process and implant process. Because trenches are filled by the additional material, the pattern transformed into the semiconductor substrate is similar with the desired pattern, only when patterned photoresist is too deformed, too wide or too curved to be repaired by filling the additional material, or pattern of patterned photoresist is significantly different from pattern of the mask.

One preferred embodiment of this invention is a method for reducing line edge roughness, with following steps.

Figure 1A:
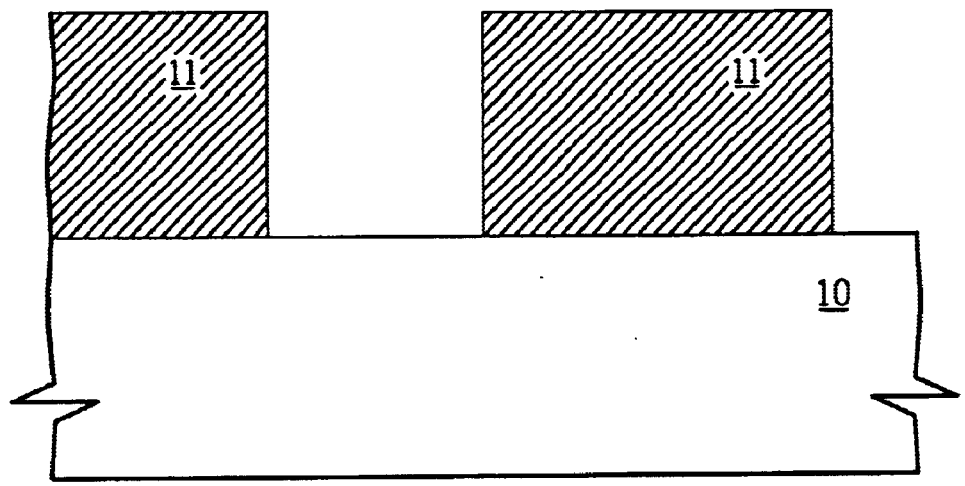
FIG. 1A to FIG. 1B are qualitative illustration about ideal shape of patterned photoresist.
Figure 1B:
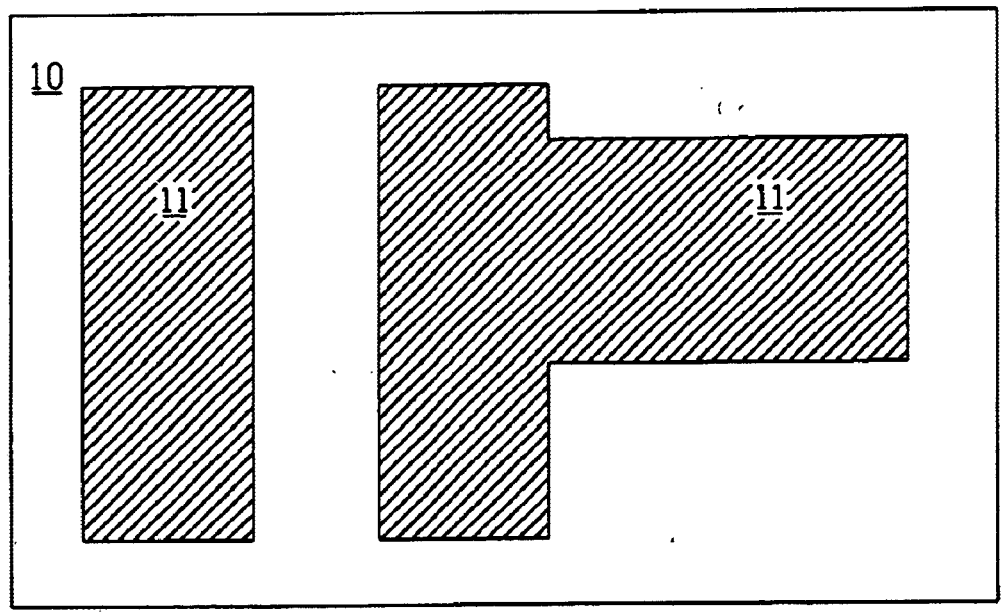
Figure 1C:
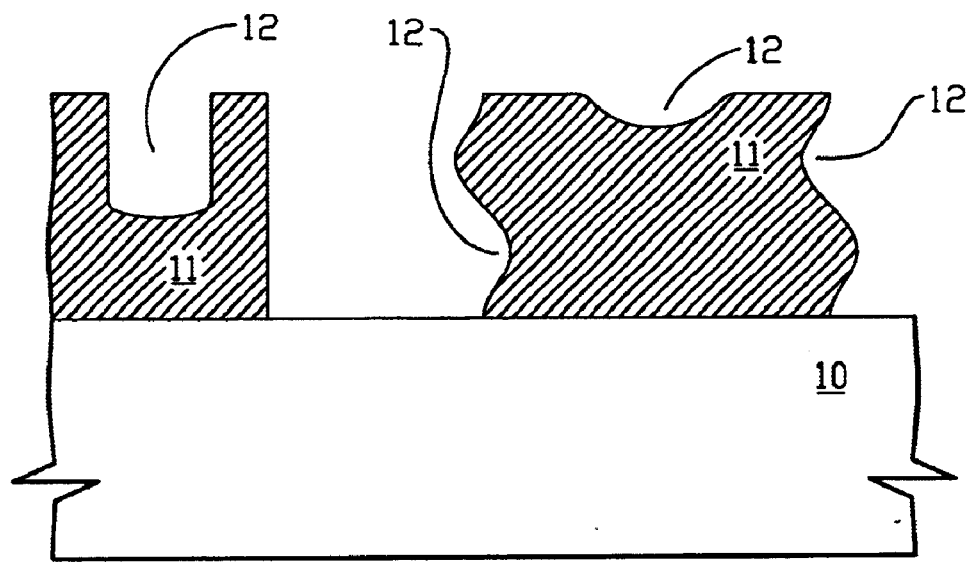
FIG. 1C to FIG. 1D are qualitative illustration about practical shape of patterned photoresist.
Figure 1D:
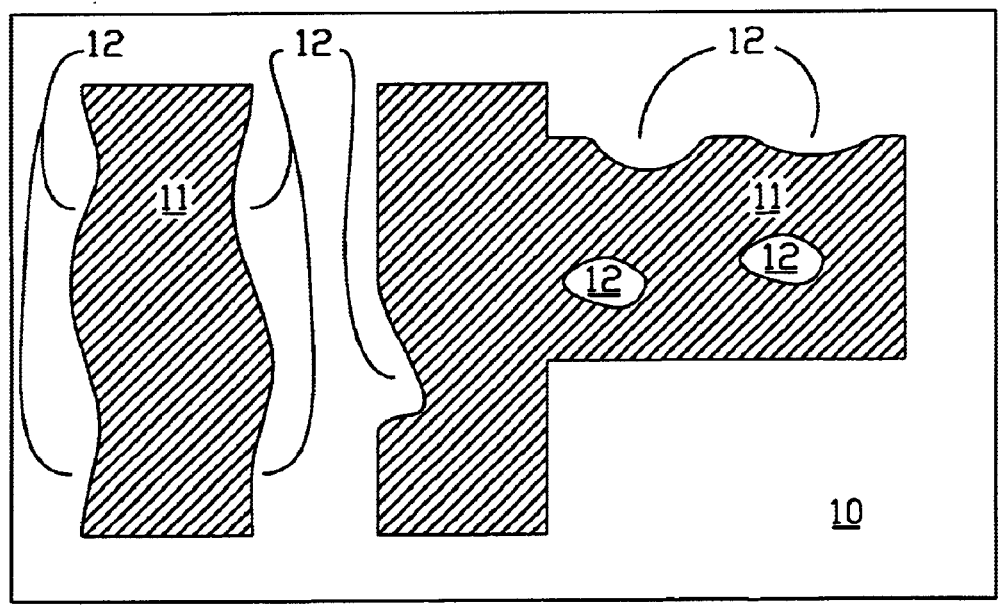
Figure 2A:
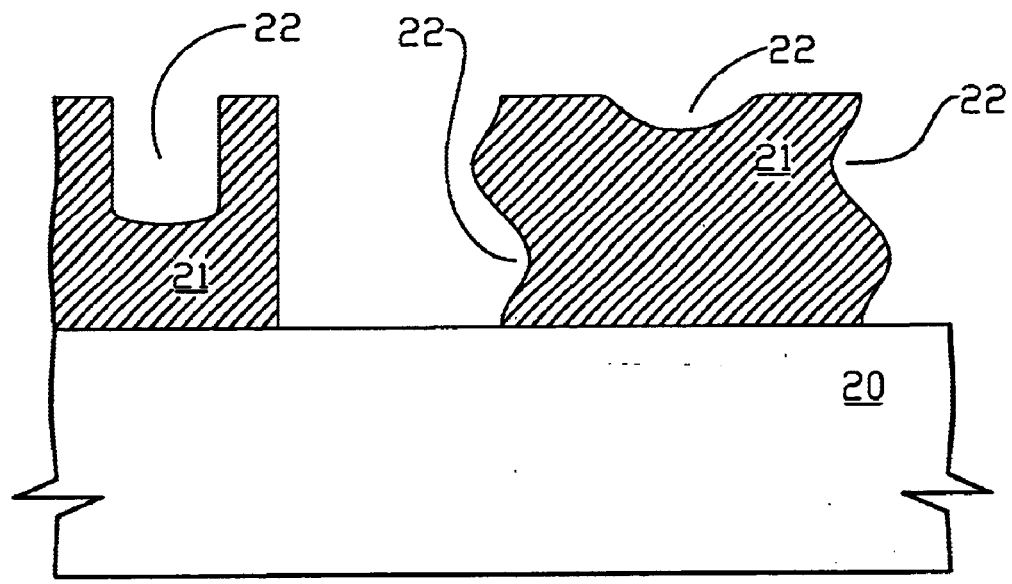
FIG. 2A through FIG. 2D are cross-sectional illustrations of one preferred embodiment of this present invention.
Figure 2B:
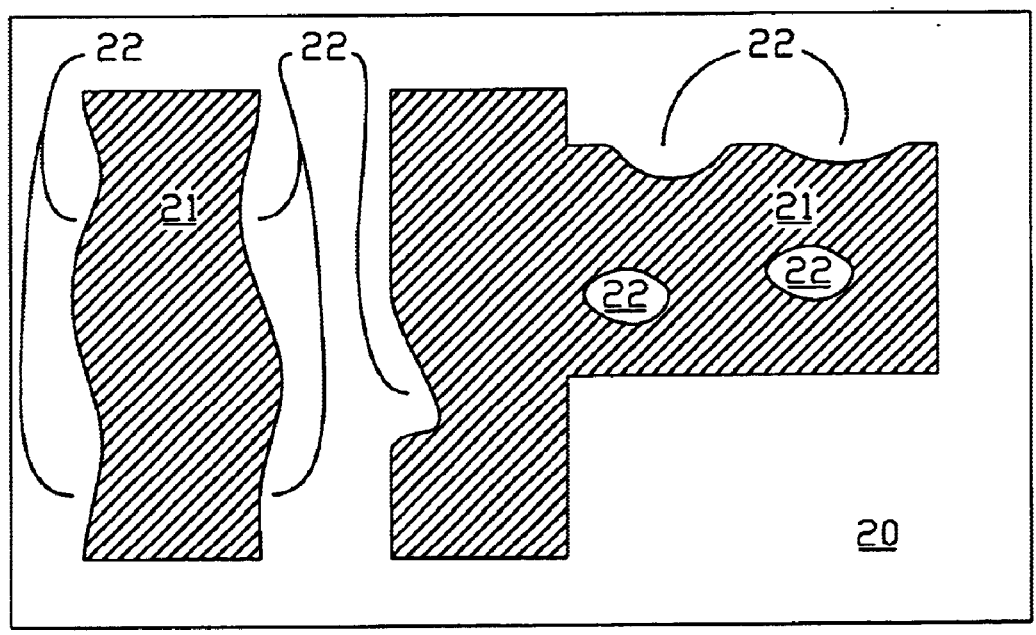

As shown in FIG. 2A and FIG. 2B, provide patterned photoresist 21 which is located on the substrate 20 and has at least one trench 22. Herein, trenches 22 may be formed on sidewall of patterned photoresist 21 or be formed on top of patterned photoresist 21. Further, particularly emphasized, trenches 22 are unavoidable defects during the formation of patterned photoresist 21, and are randomly distributed.

Figure 2C:
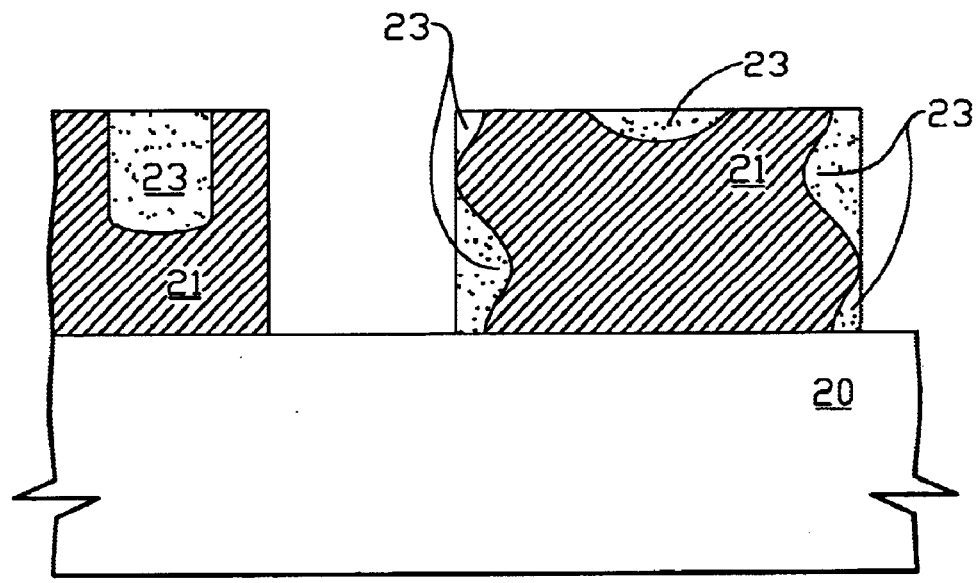
Figure 2D:
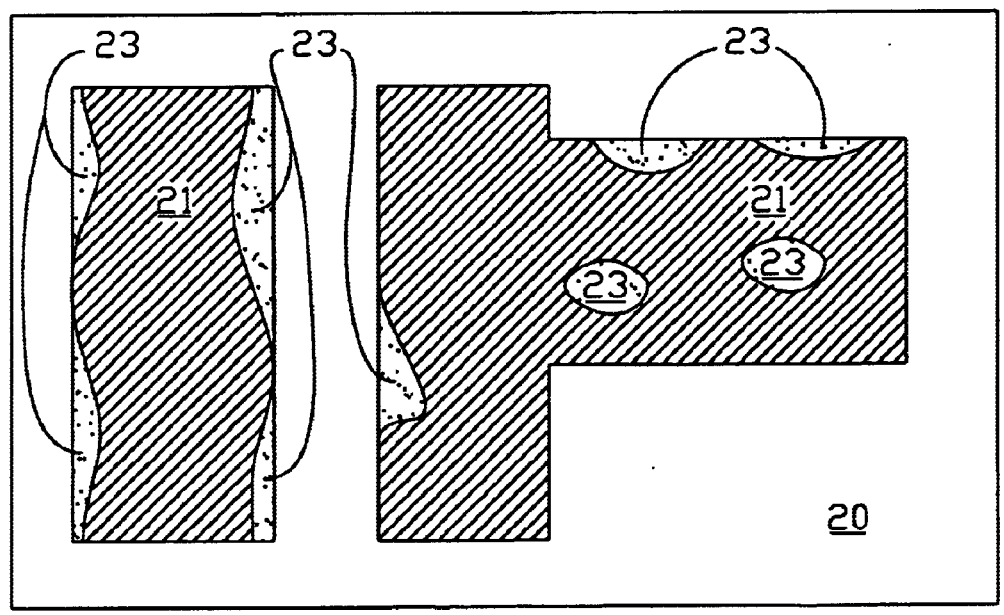

As shown in FIG. 2C and FIG. 2D, totally fills trenches 23an additional material 23. Herein, the available method for filling trenches 22 with the additional material 23 could be spin coating, dip, or spray. Moreover, to ensure the additional material 23 and patterned photoresist 21 attaches to each other effectively, the additional material 23 usually could adhere to patterned photoresist 21 by chemical reaction, such as chemical bonding, or by physical adsorption, such as capillary phenomena.

The additional material 23 could be a fluid material, such as a solution and/or a suspension, to ensure to fill all trenches totally. Moreover, the additional material 23 could be a thermosetting polymer, a thermoplasticity polymer, and/or any material which could react with hydroxyl group or proton in patterned photoresist 21. Possible materials of the additional material 23 include at least one of the following materials: PMMA, POLY IMIDE, RELACS, a material with a functional group of —NH groups, and a material with a functional group of —OH groups. Herein, PMMA, POLY IMIDE, and RELACS is well-known materials during the current semiconductor fabrication, for example, RELACS is an electronic material which is produced by Clariant Inc.

Figure 3A:
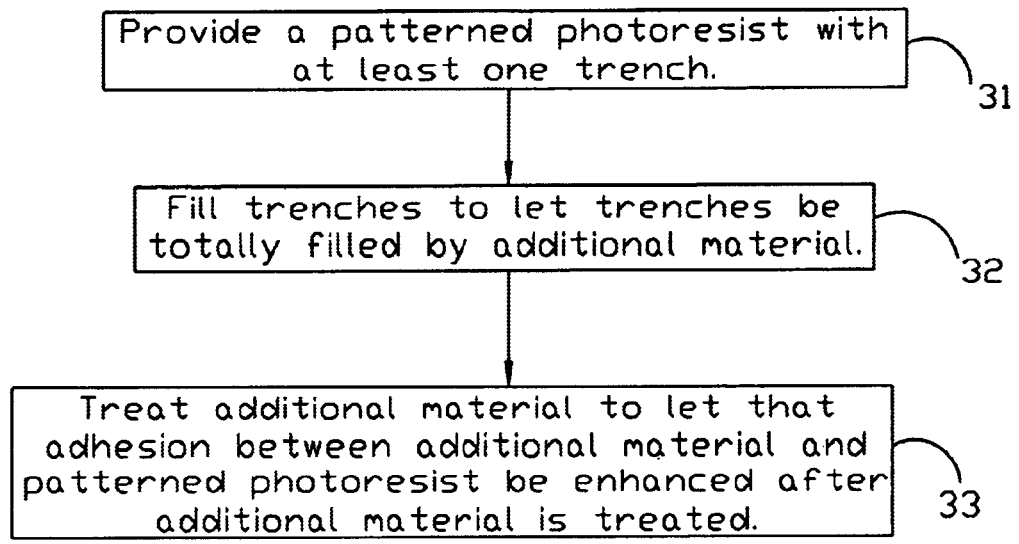
FIG. 3A through FIG. 3C are basic flow-chart of another preferred embodiment of this present invention.

However, although the additional material 23 with higher fluidity is better for filling trenches, it is possible that the additional material 23 does not firmly adhere to patterned photoresist 21, especially during the sequentially etch process or the implant process. As shown in FIG. 3A, the present invention could further perform a treat process after the additional material 23 is filled, and be adhered well between patterned photoresist 21 and the additional material 23.

As shown in patterned photoresist block 31, providing a patterned photoresist with at least one trench.

As fill block 32 shows, filling trenches to let trenches are totally filled by the additional material.

As shown in enhance adhesion block 33, treating the additional material to enhance the adhesion between the additional material and patterned photoresist. Herein, available methods for treating the additional material include at least one of following methods: thermal treatment, ultraviolet light curing, electrons beam curing, treatment of chemical reaction, and chemical reaction between numerous functional groups of patterned photoresist and numerous functional groups of the additional materials.

Figure 3B:
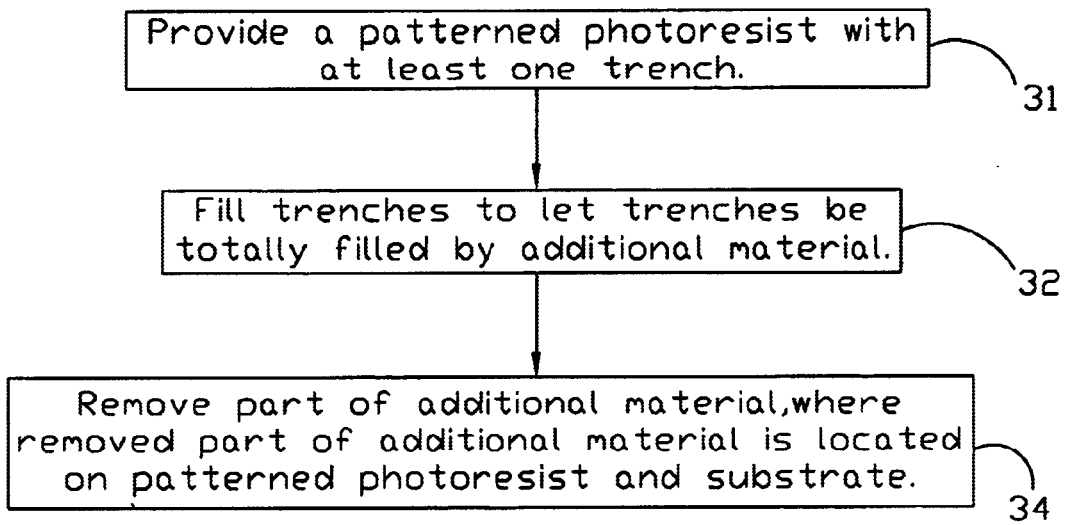

Furthermore, accuracy to fill the addition material 23 only on trenches 22 but without on the surface of patterned photoresist and/or on the substrate is hard to be controlled. Cost of precisely filling process is necessary to be reduced, and throughput of the filling process is necessary to be promoted. As shown in FIG. 3B, the present invention could further remove the additional material 23 that is formed on the surface of patterned photoresist 21 or on the substrate 20, to prevent the patterned photoresist 21 from deformed, or slightly widen.

As shown in patterned photoresist block 31, a patterned photoresist with at least one trench is provided.

As shown in fill block 32, trenches are totally filled by the additional material.

As shown in partial removal block 34, portions of the additional material that are located on patterned photoresist and the substrate are removed.

Figure 3C:
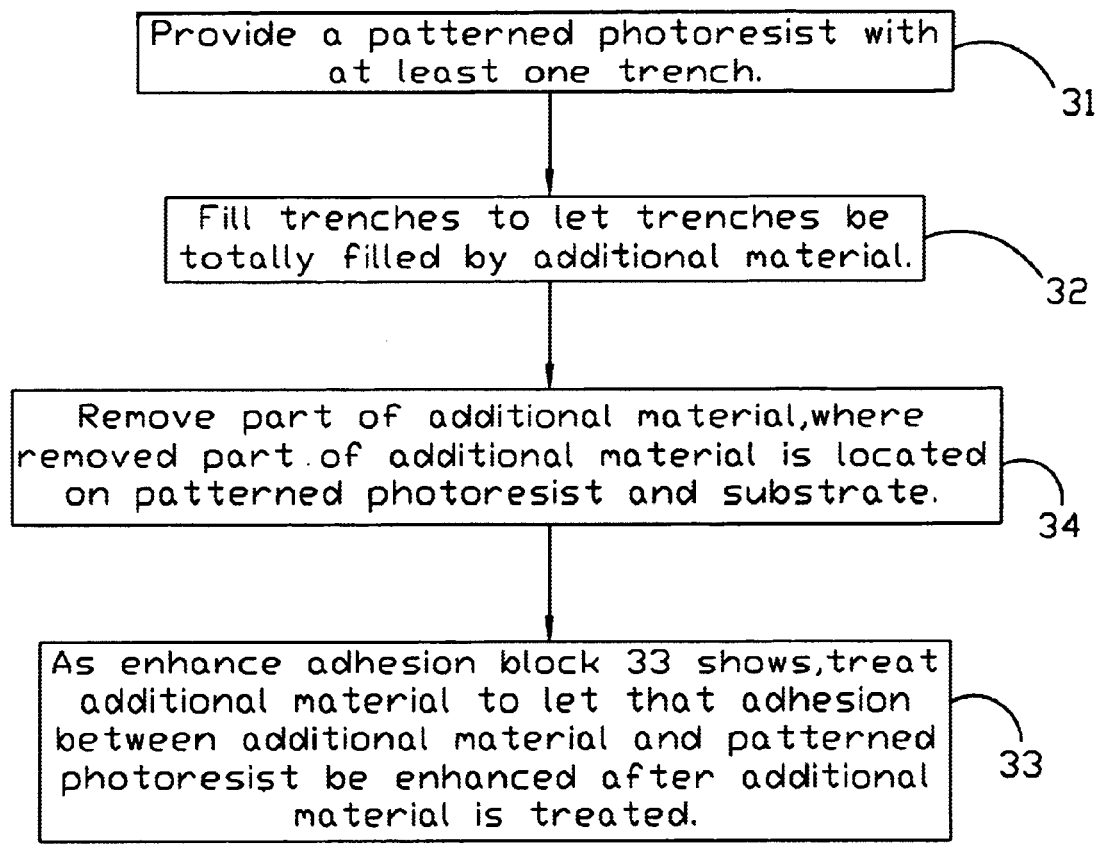

Certainly, if it is necessary, both adhesions enhance block 33 and partial removal block 34 could be used, and then basic flow-chart is shown in FIG. 3C.

As shown in patterned photoresist block 31, a patterned photoresist with at least one trench is provided.

As shown in fill block 32, trenches are totally filled by the additional material.

As shown in partial removal block 34, portions of the additional material that are located on patterned photoresist and the substrate are removed.

As shown in enhance adhesion block 33, treating the additional material to enhance the adhesion between the additional material and patterned photoresist after forming the additional material. Herein, available methods for treating the additional material include at least one of following methods: thermal treatment, violet light curing, electrons beam curing, treatment of chemical reaction, and chemical reaction between numerous functional groups of patterned photoresist and numerous functional groups of the additional materials.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A method for reducing line edge roughness of patterned photoresist, comprising:

providing a patterned photoresist, said patterned photoresist having at least a trench; and filling said trenches, said trenches being totally filled by an additional material being effective attached to said patterned photoresist;

wherein a method for filling said trenches is dip.

2. The method of claim 1, said additional material being a fluid material.

3. The method of claim 1, said additional material being chosen from the group consisting of solution and suspension.

4. The method of claim 1, said additional material being thermosetting polymer.

5. The method of claim 1, said additional material being thermoplasticity polymer.

6. The method of claim 1, said additional material could be reacted with a hydroxyl group or proton of said patterned photoresist.

7. The method of claim 1, said additional material being chosen form the group consisting of PMMA, POLY IMIDE, RELACS, material with a plurality of —NH groups, and material with a plurality of —OH groups.

8. The method of claim 1, further comprising treating said additional material to enhance the adhesion between said additional material and said patterned photoresist.

9. The method of claim 8, wherein available method for treating said additional material is chosen from the group consisting of thermal treatment, ultraviolet light curing, electrons beam curing, treatment of chemical reaction, and chemical reaction between a plurality of functional groups of said patterned photoresist and a plurality of functional groups of said additional materials.

10. The method of claim 1, further comprising removing part of said additional material, removed part of said additional material being located on said patterned photoresist and said substrate.

11. The method of claim 10, wherein available method for removing part of said additional material is chosen from the group consisting of thermal treatment and spin.

12. A method for reducing line edge roughness of patterned photoresist, comprising:

providing a patterned photoresist, said patterned photoresist having at least a trench; and filling said trenches, said trenches being totally filled by an additional material being effective attached to said patterned photoresist, wherein a method for filling said trenches is spray.

13. The method of claim 12, said additional material being a fluid material.

14. The method of claim 12, said additional material being chosen from the group consisting of solution and suspension.

15. The method of claim 12, said additional material being thermosetting polymer.

16. The method of claim 12, said additional material being thermoplasticity polymer.

17. The method of claim 12, said additional material could be reacted with a hydroxyl group or proton of said patterned photoresist.

18. The method of claim 12, said additional material being chosen form the group consisting of PMMA, POLY IMIDE, RELACS, material with a plurality of —NH groups, and material with a plurality of —OH groups.

19. The method of claim 12, further comprising treating said additional material to enhance the adhesion between said additional material and said patterned photoresist.

20. The method of claim 19, wherein available method for treating said additional material is chosen from the group consisting of thermal treatment, ultraviolet light curing, electrons beam curing, treatment of chemical reaction, and chemical reaction between a plurality of functional groups of said patterned photoresist and a plurality of functional groups of said additional materials.

21. The method of claim 12, further comprising removing part of said additional material, removed part of said additional material being located on said patterned photoresist and said substrate.

22. The method of claim 21, wherein available method for removing part of said additional material is chosen from the group consisting of thermal treatment and spin.

23. A method for reducing line edge roughness of patterned photoresist, comprising:

providing a patterned photoresist, said patterned photoresist having at least a trench; and filling said trenches, said trenches being totally filled by an additional material being effective attached to said patterned photoresist, wherein a method for filling said trenches is spin coating.

24. The method of claim 23, said additional material being a fluid material.

25. The method of claim 23, said additional material being chosen from the group consisting of solution and suspension.

26. The method of claim 23, said additional material being thermosetting polymer.

27. The method of claim 23, said additional material being thermoplasticity polymer.

28. The method of claim 23, said additional material could be reacted with a hydroxyl group or proton of said patterned photoresist.

29. The method of claim 23, said additional material being chosen form the group consisting of PMMA, POLY IMIDE, RELACS, material with a plurality of —NH groups, and material with a plurality of —OH groups.

30. The method of claim 23, further comprising treating said additional material to enhance the adhesion between said additional material and said patterned photoresist.

31. The method of claim 30, wherein available method for treating said additional material is chosen from the group consisting of thermal treatment, ultraviolet light curing, electrons beam curing, treatment of chemical reaction, and chemical reaction between a plurality of functional groups of said patterned photoresist and a plurality of functional groups of said additional materials.

32. The method of claim 23, further comprising removing part of said additional material, removed part of said additional material being located on said patterned photoresist and said substrate.

33. The method of claim 32, wherein available method for removing part of said additional material is chosen from the group consisting of thermal treatment and spin.

\* \* \* \* \*